United States Patent
Nicollian et al.

(10) Patent No.: US 7,737,717 B2
(45) Date of Patent: Jun. 15, 2010

(54) CURRENT-VOLTAGE-BASED METHOD FOR EVALUATING THIN DIELECTRICS BASED ON INTERFACE TRAPS

(75) Inventors: Paul Edward Nicollian, Dallas, TX (US); Anand T. Krishnan, Farmers Branch, TX (US); Vijay K. Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 12/209,986

(22) Filed: Sep. 12, 2008

(65) Prior Publication Data

US 2009/0224795 A1 Sep. 10, 2009

Related U.S. Application Data

(60) Provisional application No. 61/033,917, filed on Mar. 5, 2008.

(51) Int. Cl.
*G01R 31/26* (2006.01)
(52) U.S. Cl. ...................... 324/769; 324/765
(58) Field of Classification Search ......... 324/763–769, 324/158.1; 438/14–18; 257/48
See application file for complete search history.

(56) References Cited

U.S. PATENT DOCUMENTS

| 5,999,011 | A * | 12/1999 | Chu et al. .................... 324/769 |
| 6,815,970 | B2 * | 11/2004 | Rost et al. .................... 324/765 |
| 2003/0224545 | A1 | 12/2003 | Chung et al. |
| 2006/0076971 | A1 * | 4/2006 | Krishnan et al. ............ 324/765 |
| 2008/0096292 | A1 | 4/2008 | Chatterjee |
| 2008/0129326 | A1 * | 6/2008 | Agarwal et al. ............. 324/769 |

OTHER PUBLICATIONS

Nicollian et al, Texas Instruments Inc.; Low Voltage Stress-Induced-Leakage-Current in Ultrathin Gate Oxides; pp. 400-404.
Paul E. Nicollian; Thesis: Physics of Trap Generation And Electrical Breakdown In Ultra-Thin SiO2 and SiON Gate Dielectric Materials, Aug. 2007; pp. 1-174.

* cited by examiner

*Primary Examiner*—Ha Tran T Nguyen
*Assistant Examiner*—Arleen M Vazquez
(74) *Attorney, Agent, or Firm*—Jacqueline J. Garner; Wade J. Brady, III; Frederick J. Telecky, Jr.

(57) ABSTRACT

A method for evaluating gate dielectrics (100) includes providing a test structure (101). The test structure includes a gate stack that includes a gate electrode on a gate dielectric on a substrate, and at least one diffusion region diffused in the substrate including a portion below the gate stack and a portion beyond the gate stack. Pre-stress off-state I-V testing (102) is performed on the test structure to obtain pre-stress I-V test data, wherein the pre-stress off-state I-V testing includes a first measurement involving the gate electrode, the substrate and the diffusion region, a second measurement involving the gate electrode and the substrate with the diffusion region floating, and a third measurement involving the gate electrode and the diffusion region with the substrate floating. The test structure is then stressed (103) including electrically stressing for a time (t). Following the stressing, post-stress I-V testing is performed (104) wherein the first, second and third measurements are repeated to obtain post-stress I-V test data. The gate dielectric is evaluated (105) from the pre-stress and post-stress I-V test data.

16 Claims, 5 Drawing Sheets

| $V_{PEAK}$ [V] | Terminals sensing traps at poly-SiON interface | Terminals sensing traps at pwell-SiON interface |
|---|---|---|
| -1.02 | $I_D, I_G$ | $I_B, I_G$ |
| -0.64 | | $I_B, I_D, I_G$ |
| -0.26 | | $I_B, I_G$ |
| -0.14 | $I_D, I_G$ | |
| +0.16 | $I_B, I_G$ | |

CURRENT-VOLTAGE-BASED METHOD FOR EVALUATING THIN DIELECTRICS BASED ON INTERFACE TRAPS

CROSS REFERENCE TO RELATED APPLICATIONS

This application claims the benefit of Provisional Application Ser. No. 61/033,917 entitled "Method for Detecting Stress Generated Traps at the Poly-Insulator and Substrate-Insulator Interfaces in Ultra Thin SiON Dielectrics", filed Mar. 5, 2008, which is herein incorporated by reference in its entirety.

FIELD

Embodiments of the invention relate generally to methods for evaluating gate dielectrics in semiconductor products and, more specifically, to a test apparatus and method for evaluation of gate dielectric reliability.

BACKGROUND

Thin gate dielectric reliability and integrity comprise one of the major challenges for the development and manufacturing of VLSI (very large scale integration) and ULSI (ultra large scale integration) semiconductor products. The development of reliable and high quality thin gate dielectrics requires research and time-intensive efforts to meet demands for smaller device geometries and better performance and reliability. As the thickness of the gate dielectric continues to be reduced to meet industry demands, continuous process improvements are necessary to meet yield and reliability criteria.

It is currently known to collect life stress data using a stress to measure the effects of lifetime-accelerated voltage and temperature conditions on thin gate dielectric layers. After the application of accelerated life stress conditions, the chips are tested again, and a significant increase in gate leakage from its initial value signifies degradation, such as dielectric breakdown.

A common problem with incorporating dielectrics, in particular high-k dielectrics, into integrated circuit devices is the presence of dielectric interface traps. Dielectric Interface traps are electrically active defects located at the dielectric interface with the semiconductor and gate electrode materials, that are capable of trapping and de-trapping charge carriers. For example, ultraviolet light may induce an increased density of electronic states or traps at semiconductor-insulator interfaces, or—in general—at all interfaces of two facing materials that possess different electronic properties. This locally enhanced density of states may cause generation/recombination currents via a combination of tunneling and field emission. Since integrated electronic entities become more and more sensitive upon miniaturization as far as signal accuracy is concerned, such effects are very undesirable. Above all, an uncontrolled increase of the density of interface traps may interfere with capacitors and transistors causing the destruction of memory content or severely limiting the reliable operation of the electronic entities of a memory device. In particular, the so-called data retention time of an electronic memory device may be drastically reduced, the retention time being defined as the time span a memory cell may reliably store a respective logical state.

A conventional approach for obtaining some limited dielectric interface trap data is the Capacitance-Voltage (CV) method. Unfortunately, the C-V method only senses interface traps at the dielectric/semiconductor interface. Moreover, the C-V method is difficult to apply to thin dielectric films (e.g. <4 nm equivalent oxide thickness (EOT)) particularly when high gate dielectric leakage is present. Another known approach is referred to as the Charge-Pumping (CP) method. Like the C-V method, the CP method is difficult to apply to thin dielectric films when high gate leakage is present.

Although the above described methods can generally be used to resolve interface traps at the dielectric/semiconductor interface when the gate leakage is relatively low, these methods are not capable of resolving traps at the gate electrode/dielectric interface. Without the ability to resolve the interface traps at the dielectric/semiconductor interface traps, gate dielectrics cannot be fully characterized, and as process development activities related to enhancing the reliability of dielectrics including gate dielectrics may be retarded. Accordingly, there is a need to provide a new approach to the measurement of interface traps for thin gate dielectrics that permits resolving the build up of interface traps at the gate dielectric/semiconductor interface from the build up of traps at the gate electrode/gate dielectric interface.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe carrier separation methods applicable for thin dielectric comprising devices. Some useful data can be obtained from 2-terminal measurements, allowing dielectrics associated with 2-terminal structures such capacitors to be characterized using an embodiment of the invention, such as described below relative to FIG. 4. However, the full capability of embodiments of the invention generally needs a 3-terminal measurement on a device having at least 3-terminals. As used herein, a "thin dielectric" corresponds to a dielectric having an EOT of <3.5 nm. Although generally described for evaluating SiON dielectrics, embodiments of the invention are generally applicable to all dielectrics, whether high-k (such as SiON) or silicon dioxide (non high-k). High-k is defined herein as dielectrics having a k-value at least 4, such as 15-50. A series of current-voltage (I-V) tests are performed on the device using a plurality of different bias configurations both before and after stressing and a measure of the build-up of interface traps at the substrate/dielectric interface is obtained separate from a measure of the stress built-up traps at the gate electrode/dielectric interface.

In one inventive arrangement, a voltage referred to herein as a sense voltage is applied to the gate electrode of the device with a plurality of different bias configurations comprising different combinations of grounding at least one of the one of the substrate (e.g. body) and a diffused region in the substrate. It has been discovered by the present Inventors that for sense voltages in the off-state, which corresponds to the body region under the gate electrode not being inverted, the increase in post stress current in the substrate terminal when the diffusion region is floating only generally senses traps at the substrate/dielectric interface. When the post stress current is measured in the off-state at a voltage corresponding to a peak in the gate current, the increase in current in the diffusion region terminal with the substrate floating generally only senses interface traps at the gate electrode/dielectric interface. Thus, embodiments of the invention thus provide methods for resolving the stress built-up traps at the substrate/dielectric interface from stress built-up traps at the gate electrode/dielectric interface.

Embodiments of the invention generally provides the same post-stress information whether the device is stressed with constant current or constant voltage. Since it is customary at the present time to stress with constant voltage since this is how reliability assessments to determine product failure rates are conventionally done, embodiments of the invention will be described using forced voltage and measured current, with the understanding embodiments of the invention may be practiced by forcing current and measuring voltage.

DETAILED DESCRIPTION

Figure 1:
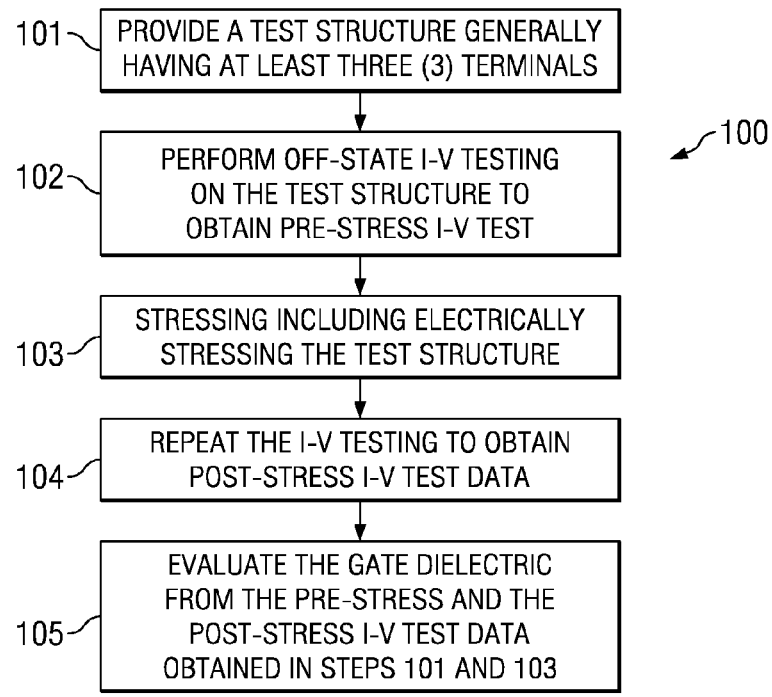
FIG. 1 is a flow chart for an exemplary method for detecting stress generated interface traps at both the dielectric/semiconductor interface and the dielectric/gate electrode interface, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe current-voltage (I-V) methods that provide carrier separation that includes dielectric interface state information that permits separate measures for dielectric/substrate (e.g. semiconductor) interface traps and dielectric/gate electrode interface traps. As described above, embodiments of the invention are generally based on I-V measurements of dielectric comprising devices comprising at least three (3) terminals. Pre-stress I-V measurements are performed on the device in different bias configurations and the data is stored. The device is then stressed to electrically and thermally stress the dielectric since trap generation is thermally activated. The temperature for the thermal stress is generally from 50° C. to 125° C. Following stressing, I-V measurements are performed on the device in the different bias configurations and the post-stress data is compared to the stored pre-stress data. The result is an I-V spectra that based on a discovery by the present Inventors can be used as described below to provide separate measure for stress generated traps at the dielectric/substrate interface from interface traps at the gate dielectric/dielectric interface.

The present Inventors have recognized that when the dielectric thickness is below a certain threshold, such as when an EOT is scaled below 7 nm, a steady-state post stress gate current is observed, primarily when it is measured in the direct tunneling regime. This instability is referred to herein as stress-induced-leakage-current (SILC). However, the present Inventors have observed for dielectric thicknesses less than about 3.5 nm EOT, a post-stress sense voltage dependent steady-state leakage instability is observed when the gate current is measured in the off-state. This effect is referred to herein as low voltage stress-induced-leakage-current (LV-SILC).

The present inventors have discovered that when the device is sensed in the off-state, such as Vgs<0 volts for an NMOS enhancement mode device, an increase (relative to pre-stress level) in current in the substrate (e.g. body) terminal detects traps at the substrate/dielectric interface. An increase (relative to pre-stress level) in current in the drain terminal detects traps at the gate electrode (e.g. polysilicon)/dielectric interface. Embodiments of the present invention are clearly distinguished compared with other solutions for detecting interface traps since as noted above conventional methodologies only measure interface traps at the substrate-dielectric interface.

With interface trap information for both dielectric interfaces is provided, dielectric layers can be better characterized, such as for enhancing process development activities to improve dielectric reliability, and in some cases improving yield as well. Significantly, no new test structures are required beyond standard test modules.

FIG. 1 is a flow chart for an exemplary method 100 for detecting stress generated interface traps at both the dielectric/semiconductor interface and the dielectric/gate electrode interface, according to an embodiment of the invention. Step 101 comprises providing a test structure. The test structure comprises a device having at least three (3) terminals comprising a gate stack comprising a gate electrode on a gate dielectric on a substrate, and at least one diffusion region diffused in the substrate including a portion below the gate stack and a portion beyond the gate stack. The substrate can be a well diffused into a substrate (e.g. a p-well diffused in a n-substrate), or a substrate itself (e.g. n-substrate). Although only three (3) terminals are generally needed for testing, the test structure can comprise a MOS transistor, either being an NMOS or a PMOS transistor (and thus includes an extra fourth terminal). The test structure can also be embodied as an array of test structures, such as a transistor array.

Step 102 comprises performing off-state I-V testing on the test structure to obtain pre-stress I-V test data. "Off-state" refers to gate to substrate (Vgs) test conditions that do not invert the surface of the substrate under the gate, generally referred to herein as being the channel region in the case of a MOS transistor. For an NMOS transistor having a voltage threshold of 1 V, for example, "off-state" refers to a Vgs<1 V. The off-state I-V testing at step 101 comprises (i) a first measurement involving the gate electrode, the substrate and the diffusion region, (ii) a second measurement involving the gate electrode and the substrate with the diffusion region floating, and (iii) a third measurement involving the gate electrode and the diffusion region with the substrate floating. When the drain or, substrate is not floating, they are generally at ground (zero) potential. As used herein, $I_G(0)$, $I_D(0)$, and $I_B(0)$ represent the currents at time=0 (before stressing). Data comprising $I_G(O)$, $I_D(0)$, and $I_B(0)$ each as a function of the gate voltage is then generally saved.

Step 103 comprises stressing the test structure for a time (t), wherein the stressing includes electrically stressing. The voltage across the dielectric during stressing should be low enough to avoid dielectric breakdown, such as several volts in the case of a 3.5 nm thick silicon dioxide or SiON dielectric. Although the physical process of driving electrons and/or holes across the gate dielectric associated with embodiments of the invention is thermally activated and is thus generally temperature dependent, the selection of a stress temperature is essentially arbitrary. Although stress temperatures in the approximate temperature range of 0° C. to 200° C. range has generally been used by the Inventors, it is likely temperatures both above and below this temperature range may be used with embodiments of the invention. Like the stress temperature, the stress time is generally essentially arbitrary. The inventors have successfully applied the embodiments of the invention using stress times ranging from 1 second to about 3 weeks, with typical stress times being minutes to several hours.

Rather than or in addition to stress time, carrier fluence may also be used as a stress parameter. As noted above, the generation of the trap states that embodiments of the invention characterizes is generally driven by the fluence (Q) of electrons and/or holes across the gate dielectric, where $Q=\int J_G dt$ integrated from time=0 to time=t, and $J_G$ is the current density flowing across the gate dielectric. In this framework, the Inventors have applied embodiments of the invention with Q values ranging from about 0.01 C/cm$^2$ to over 1 billion C/cm$^2$.

Step 104 comprises repeating the off-state I-V testing (analogous to step 102) to obtain post-stress I-V test data. As used herein, $I_G(t)$, $I_D(t)$, and $I_B(t)$ are the currents after stress time=t. Data comprising $I_G(t)$, $I_D(t)$, and $I_B(t)$ each as a function of gate voltage in the voltage range described above is then generally saved.

Step 105 comprises evaluating the gate dielectric from the pre-stress and the post-stress I-V test data obtained in step 102 and 104. In one embodiment, the evaluation includes detecting the build-up of dielectric interface traps, which has been found by the Inventors to generally be proportional to $I_G(t)/I_G(0)$, and/or $I_D(t)/I_D(0)$, and/or $I_B(t)/I_B(0)$. The build-up of interface traps can also be expressed as $\Delta I_G/I_G(0)$, and/or $\Delta I_D/I_D(0)$, and/or $\Delta I_B/I_B(0)$, where $\Delta I_G=I_G(t)-I_G(0)$, $\Delta I_D=I_D(t)-I_D(0)$, and $\Delta I_B=I_B(t)-I_B(0)$.

The ability to resolve the effects of interface states at the dielectric/semiconductor interface (through LV-SILC) and bulk traps (through SILC) on the reliability of gate dielectrics has provided insight into the trap distributions dielectric/semiconductor interface and degradation mechanisms of this interface that can lead to the breakdown of thin dielectrics, such as ultra thin $SiO_2$ and SiON films. Methods according to embodiments of the invention can be used for determining the semiconductor processing technologies that result in improved gate dielectric reliability.

Embodiments of the method described above may be used to compare at least two sample wafers, each sample wafer manufactured by a different candidate dielectric process. The dielectric process that produces the sample wafer having the lowest build up of interface traps due to stress may then be selected as the favored process since a lower build up of interface traps generally results in generally improved dielectric reliability.

Embodiments of the method described above may be used for on-board reliability assessment of integrated circuits. For example, one or more test structures according to embodiments of the invention may be formed on a wafer having a semiconductor surface, wherein the wafer includes a plurality of integrated circuit die. In this embodiment, the evaluating comprises comparing at least one parameter obtained from said pre and post-stress I-V test data for the gate dielectric to at least one reference value for the parameter, and deciding whether to pass or accept the wafer based on the comparing. In another embodiment, the test structure according to an embodiment of the invention is on a semiconductor die comprising a substrate having a semiconductor surface, and at least one functional circuit on the die. in this embodiment, the evaluating comprises comparing at least one parameter obtained from the pre and post-stress I-V test data for the gate dielectric to at least one reference value for the parameter, and deciding whether to pass or accept the die based on the comparing.

For example, an embodiment of the invention was used to determine how trap generation at a n+poly-SiON interface influences dielectric breakdown to analyze the effect of nitrogen profile on dielectric breakdown. Specifically, an embodiment of the invention was used to show the effects of nitrogen profile uniformity on gate dielectric reliability for a SiON dielectric. P-well based NMOS transistors having n+ poly gate electrodes SiON gate dielectrics as described in the Example below with a uniform N-profile and non-uniform N-profile were both prepared. $I_G(0)$, $I_D(0)$, and $I_B(0)$ vs. $V_G$ were obtained in a single I-V sweep before stress. $I_G(t)$, $I_D(t)$, and $I_B(t)$ vs. $V_G$ were also obtained in a single sweep after stress. Data obtained indicated a lower no poly-SiON interface trap generation rate for SiON dielectrics that had a uniform N-profile resulted in significantly lower dielectric breakdown failure rates, as compared to an otherwise equivalent SiON dielectric that had a non-uniform N-profile. The process providing the uniform N-profile was thus selected as the favored process, and future SiON dielectric development could be guided by the results obtained.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

Applicants present certain theoretical aspects below that are believed to be accurate that appear to explain observations made regarding embodiments of the invention based primarily on solid-state device theory. However, embodiments of the invention may be practiced without the theoretical aspects presented. Moreover, the theoretical aspects are presented with the understanding that Applicants do not seek to be bound by the theory presented.

NMOS transistors with 1.2 nm EOT device-grade SiON dielectrics which were fabricated through plasma nitridation in a 90 nm full-flow CMOS p-well process. The gate electrode comprised n+ doped polysilicon. The NMOS transistors were than stressed at 378 K in inversion using a gate voltage of +2.2 V. Although not used, the NMOS transistors could have been stressed in accumulation rather than inversion. The channel length was $1\times10^{-4}$ cm and the gate oxide area was $3\times10^{-7}$ $cm^2$. The three (3) device terminals of the NMOS that were biased comprised the gate electrode, the substrate (or body, here the p-well) and a diffusion in the p-well under the gate (referred to as a drain) which were all connected during the stress step. The gate terminal was biased during the I-V testing (sense operation) with the other two terminals both connected to ground (referred to as "all connected") or with one of the other two terminals floating. To attain relatively large Si—SiON interface trap densities, in addition to the gate stress voltage of 2.2 V, a substrate (p-well) voltage of $V_B=-6$ V was also applied during stress, since substrate bias is known to generally increase trap generation rates through electron heating in the semiconductor. Stress time periods used ranged from 30 seconds to 3,600 seconds (1 hour) after stress at the highest temperature (378 K).

Figure 2:
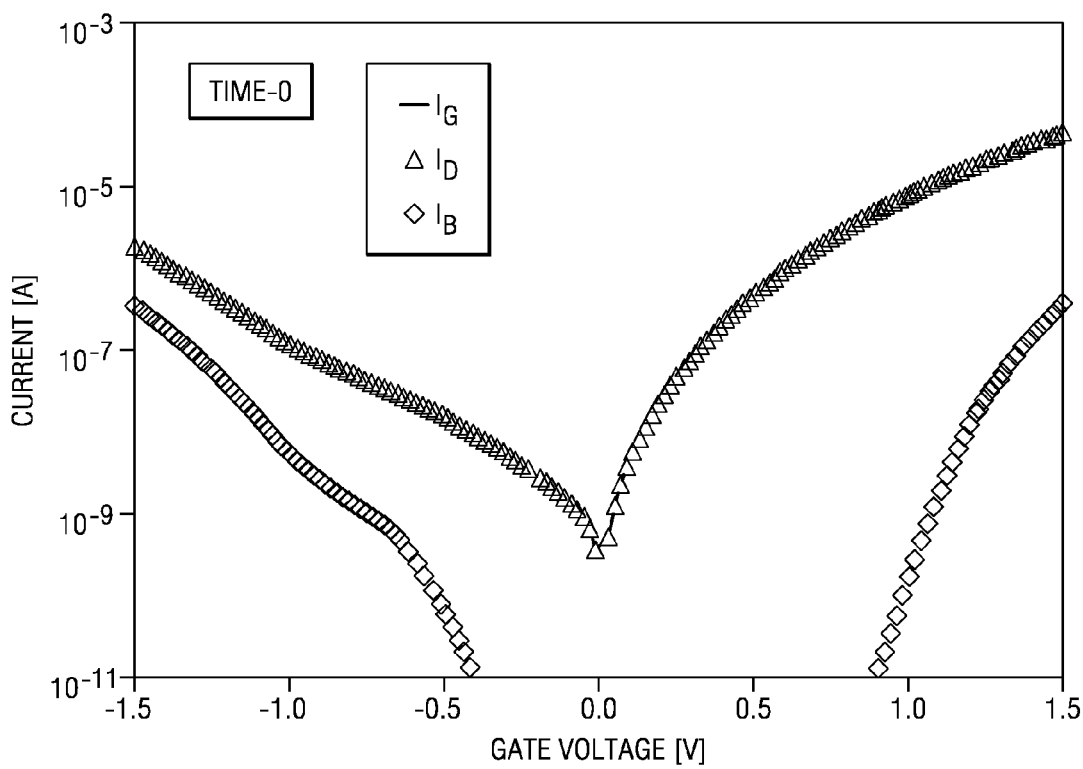
FIG. 2 shows pre-stress (time=0) NMOS terminal currents obtained at 378 K, according to an embodiment of the invention.
Figure 3:
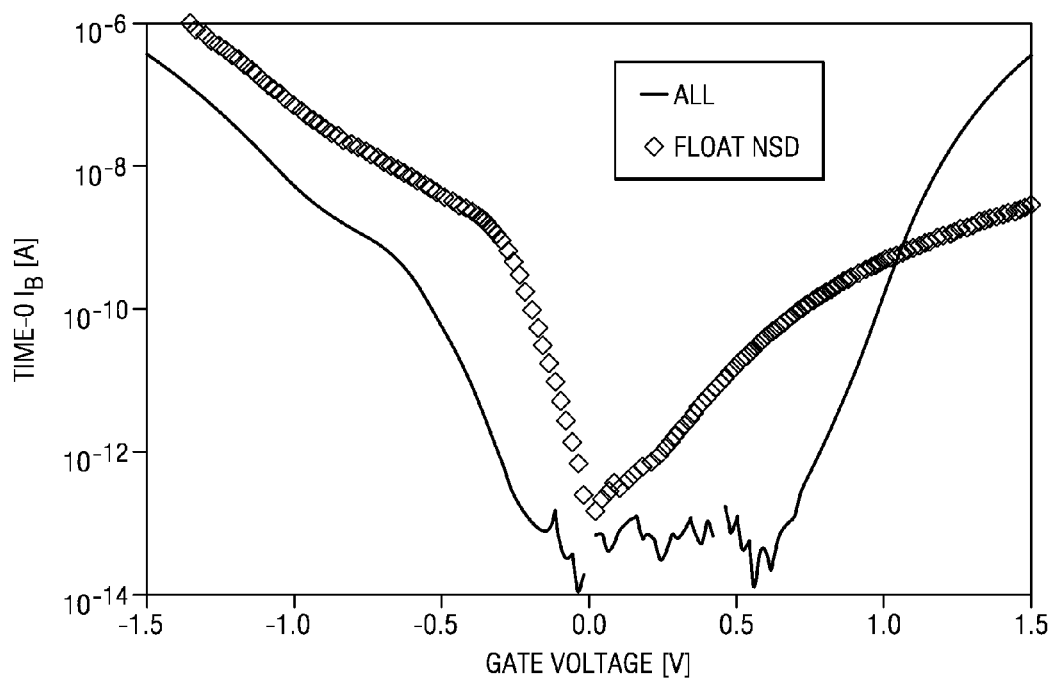
FIG. 3 shows pre-stress (time=0) $I_B$ vs. $V_B$ characteristics obtained at 378 K both with and without the drain floating during the I-V sweep, according to an embodiment of the invention.

Carrier separation as described above was used to analyze the effects of interface trap generation on gate, drain, and substrate currents, $I_G$, $I_D$ and $I_B$, respectively. Time=0 (pre-stress) I-V characteristics for the 3-terminal NMOS devices that were to be stressed were measured. Pre-stress data comprising $I_G(0)$, $I_D(0)$, and $I_B(0)$ each as a function of gate voltage as described above was then saved and shown in FIG. 2. The pertinent features obtained that can be seen in FIG. 2 are (1) For $V_G>0$ V, the gate current $I_G$ is dominated by the tunneling of conduction band (CB) electrons supplied by the drain terminal. Therefore, $I_G \sim I_D$. (2) For $V_G>1$ V, electrons from the p-well valence band (VB) can tunnel into the n+ poly conduction band. Since a hole will be generated in the p-well for every tunneling VB electron, a substrate hole current $I_B$ will arise. (3) For $V_G<0$ V, a substrate current $I_B$ arises: (i) when electrons tunnel from n+ poly to the p-well CB followed by diffusion out the p-well contact, (ii) when electrons tunnel from n+ poly into as-grow interface traps at the p-well-SiON interface followed by recombination with holes in the p-well, or (iii) when holes are injected from the p-well VB into the no poly VB. A drain current $I_D$ arises when electrons tunnel from n+ poly to the p-well CB then diffuse into the drain contact, or tunnel from n+ poly into the NSD region. In the devices tested devices, $I_G \sim I_D$ for $V_G<0$ V, From this analysis, it can be seen that a drain current $I_D$ arises when the drain supplies tunneling carriers, or when carriers that have been injected from the gate into either the NSD or p-well CB flow out of the drain contact. This can also be seen by comparing the substrate current $I_B$ with the drain floating versus all three terminals connected as shown in FIG. 3. In the off-state, the substrate current $I_B$ can be seen to be higher with the drain floating (shown as "float NSD") since the electrons injected from the gate electrode flow out of the p-well rather than the drain contact. It is noted that in the on-state, $I_B$ is also higher with the drain floating (until p-well VB tunneling becomes significant) due to increased generation rates resulting from the p-well going into deep depletion without the drain to supply inversion layer electrons.

Figure 4:
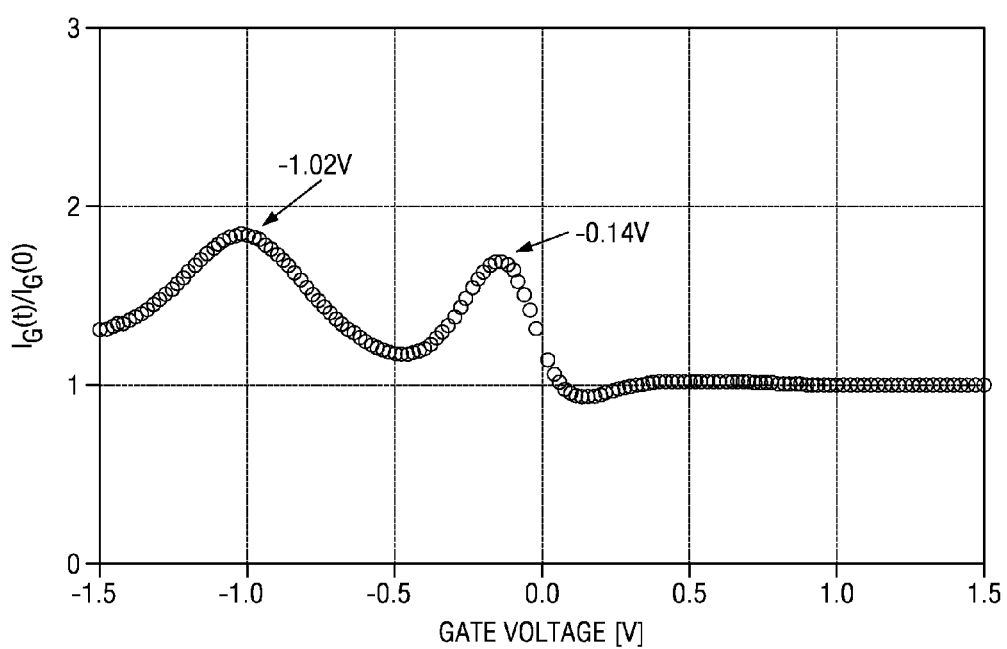
FIG. 4 shows $I_G(t)/I_G(0)$ data obtained at 378 K with all terminals are connected during the sense operation, according to an embodiment of the invention.
Figure 5:
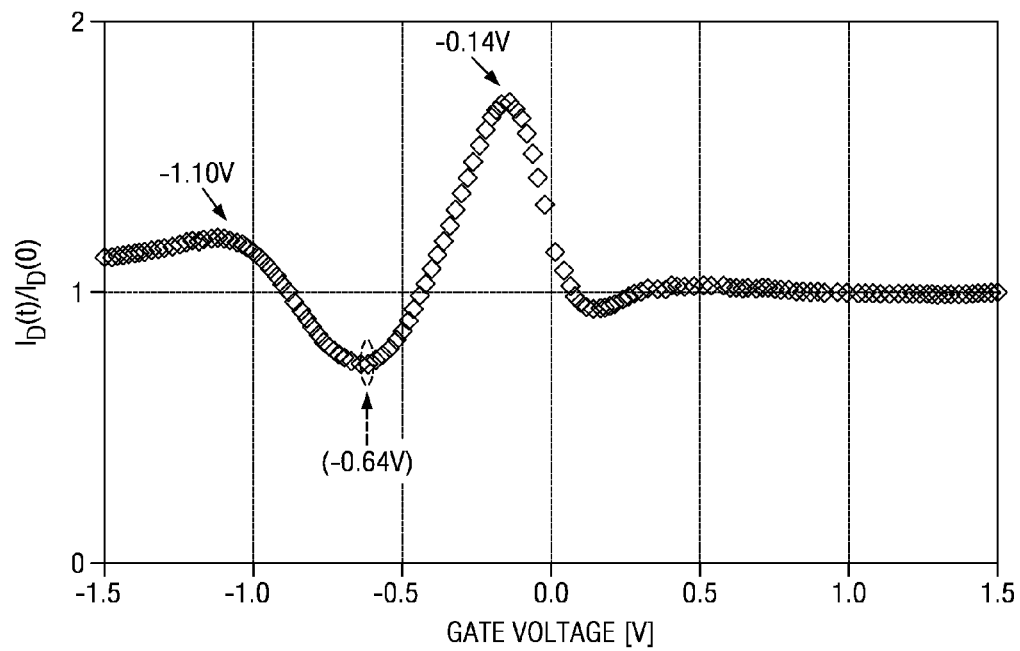
FIG. 5 shows $I_D(t)/I_D(0)$ data obtained at 378 K with all terminals are connected during the sense operation, according to an embodiment of the invention.
Figure 6:
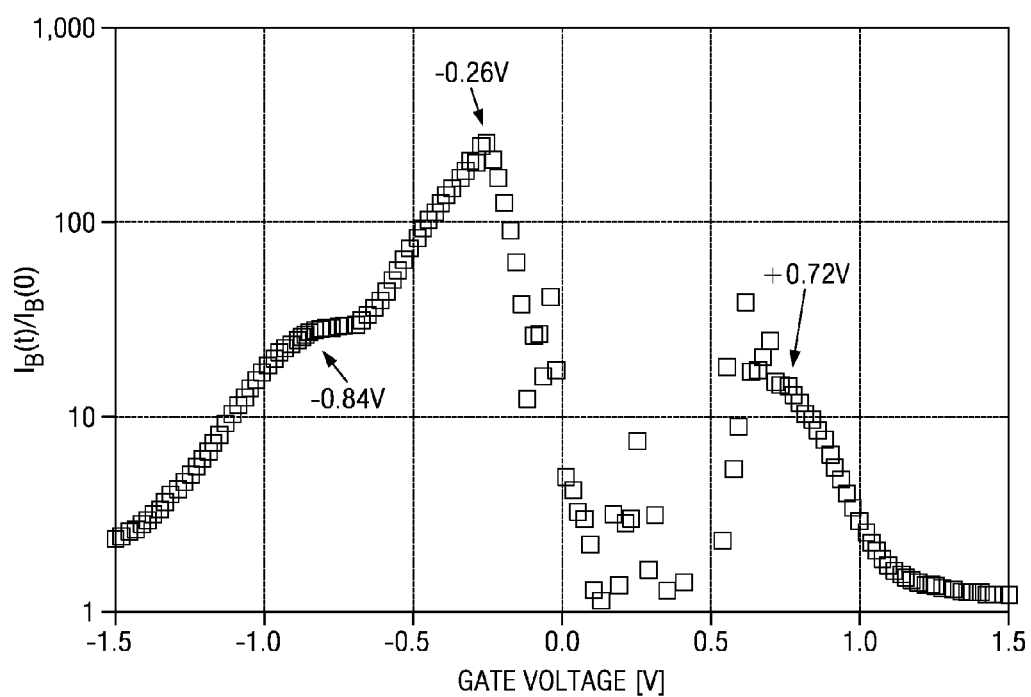
FIG. 6 shows $I_B(t)/I_B(0)$ data obtained at 378 K with all terminals connected during the sense operation, according to an embodiment of the invention.

The post-stress increase in NMOS gate, drain, and substrate currents sensed with all device terminals connected were measured, and shown in FIGS. 4-6, respectively. Two LV-SILC peaks were found to appear in the gate current for NMOS SiON films when all device terminals are connected during sense as shown in FIG. 4. Three LV-SILC peaks are present in the NMOS drain current when all three terminals are connected during sense as shown in FIG. 5. One of these peaks manifests itself as a dip in the post-stress drain current at $V_G=-0.64$ V, where $I(t)<I(0)$. This dip in $I_D$ is only seen when a substrate bias is applied during stress, where a large p-well interface trap density results. In FIG. 6, three LV-SILC peaks are observed in the NMOS substrate current when all device terminals are connected during the sense operation.

Analysis of Transport Paths

Regarding analysis of the $I_G$ peak at −1.02 V seen in FIG. 4, the nearest corresponding drain and substrate current peaks are at −1.10 V (see FIG. 5) and −0.80 V (see FIG. 6), respectively. Based on band diagram analysis, in this voltage range, the three possible transport paths that can lead to an increase in substrate current were identified as electron tunneling from the n+ poly CB into p-well interface traps followed by recombination with holes, electrons tunneling from n+ poly interface traps to p-well interface traps followed by recombination with holes, and electrons tunneling from the n+ poly valence band into p-well interface traps followed by recombination with holes. Therefore, it was concluded that the $I_G$ peak at $V_G=-1.02$ V requires traps at the p-well-SiON interface.

The transport paths that can give rise to a LV-SILC drain current in this voltage range are involve emission from interface traps at the n+ poly interface. For gate voltages near $V_{FB}$, the most likely explanations for drain current LV-SILC are tunneling from n+ poly interface traps into the p-well conduction band, followed by diffusion in the drain region, or tunneling from n+ poly interface traps into the NSD conduction band. It was subsequently shown that the correct explanation is the tunneling from n+ poly interface traps into the p-well conduction band, followed by diffusion in the drain region mechanism.

The dip in $I_D$ centered at $V_G=-0.64$ V and the peak in $I_D$ at $V_G=-0.14$ V shown in FIG. 5 were concurrently analyzed. It is noted that in FIG. 6, there is a plateau in $I_B(t)/I_B(0)$ at $V_G=-0.64$ V rather than a roll-off in degradation as the voltage is swept from the $I_B$ peak at $V_G=-0.84$ V towards 0 V. This indicates that traps at the p-well interface may still participate in LV-SILC at $V_G=-0.64$ V. Band diagram analysis revealed that the only LV-SILC paths that lead to an increase in $I_D$ in this voltage range involve tunneling into the small-area NSD overlap region. An increase in $I_D$ after stress cannot be explained by electron tunneling from no poly interface traps into the p-well CB followed by diffusion into the drain, because it is not energetically possible in this voltage range since all n+ poly interface traps will be at a lower energy than the p-well CB.

Figure 7:
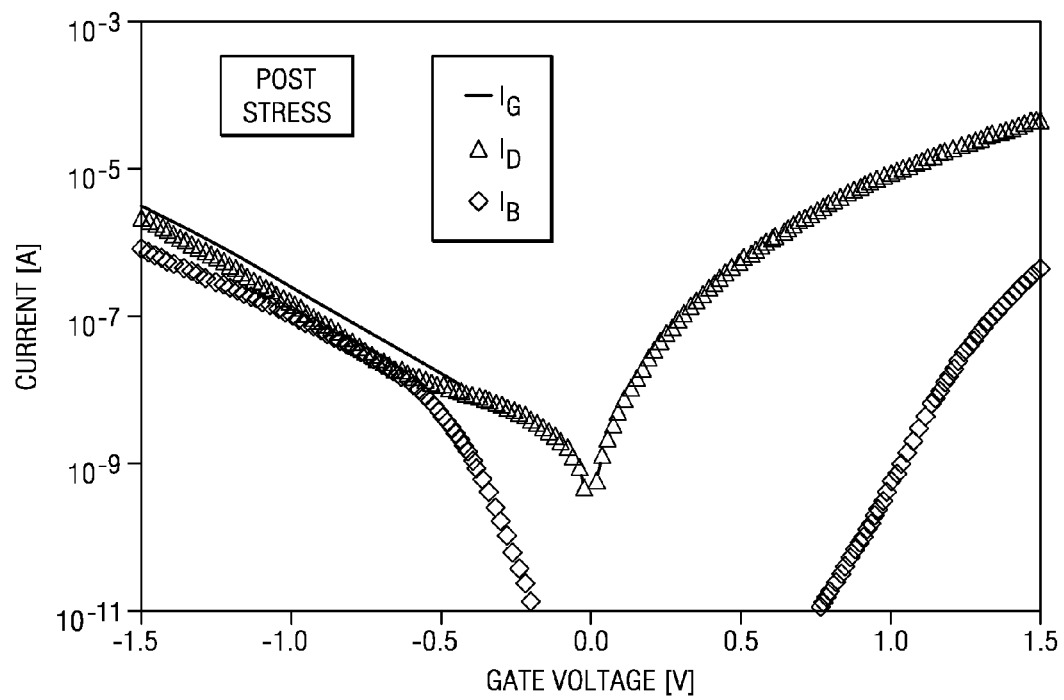
FIG. 7 shows post-stress NMOS terminal currents obtained at 378 K, according to an embodiment of the invention. The time=0 I-V curves for this device are shown in FIG. 2.

To explain the drop in $I_D$ at $V_G=-0.64$ V after stress, a mechanism is needed to explain reducing the number of electrons flowing out of the drain contact relative to unstressed condition. The post stress I-V characteristics are shown in FIG. 7, In the off-state, the increase in substrate current due to tunneling into p-well interface states is a significant contribution to the total current until $V_G>\sim-0.5$ V. A possible explanation for the dip at $V_G=-0.64$ V is electron tunneling from the n+ poly into p-well interface traps that are in close proximity to the NSD) edge. This reduces the number of electrons that flow out of the drain contact relative to time-0. A drop in $I_D$ would occur until the magnitude of the gate voltage is reduced to a small enough value that the energy range of p-well interface traps that can participate in LV-SILC has diminished. Thereafter, LV-SILC in the gate terminal is dominated by tunneling into the NSD region, resulting in the coincident LV-SILC peaks in the drain and gate currents at $V_G=-0.14$ V seen in FIGS. 4 and 5.

Figure 8:
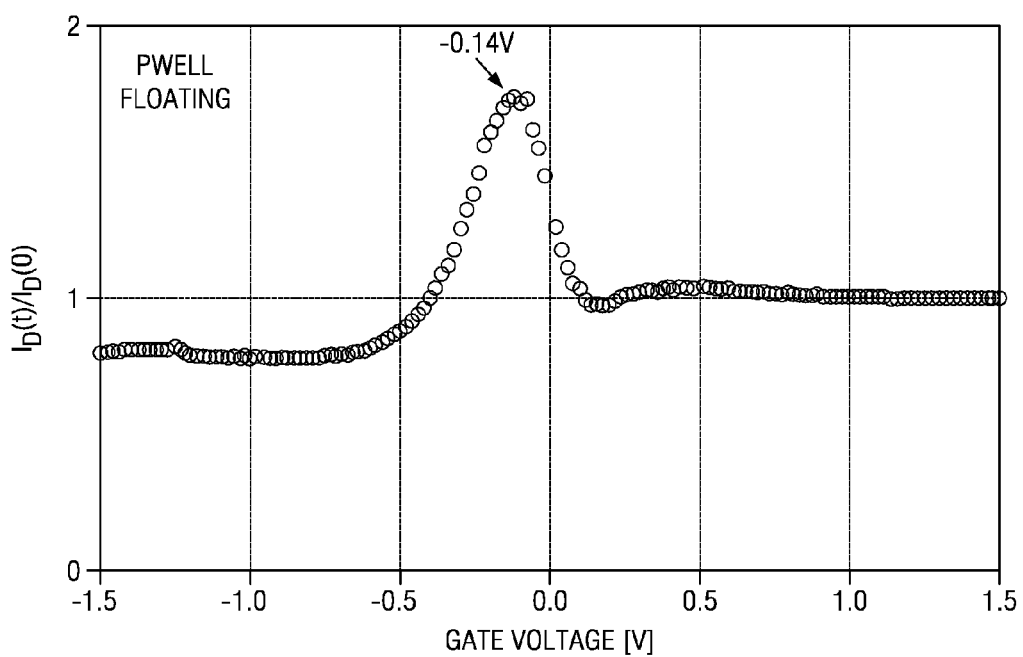
FIG. 8 shows $I_D(t)/I_D(0)$ data obtained at 378 K with the p-well floating during the sense operation, according to an embodiment of the invention.

The post-stress increase in $I_D$ sensed with the p-well floating is shown in FIG. 8. The dip at $V_G=-0.64$ V vanishes, which confirms that its origin is the reduction in the number of electrons that are injected into the drain contact relative to the unstressed condition due recombination in p-well interface traps. In FIG. 8, the drain current peak at $V_G=-1.10$ V has also disappeared, verifying that it is due to tunneling from n+ poly interface traps into the p-well CB, followed by diffusion of these electrons in to the drain contact. Also from FIG. 8, the LV-SILC mechanisms where electrons tunnel into the NSD region can be eliminated as the origin of the drain current peak at $V_G$-1.10 V. Therefore, traps at both n+ poly-SiON and p-well-SiON interfaces participate in LV-SILC when the device is sensed near $V_{PB}$ for the n+ poly over p-well region. Only the drain current peak at $V_G=-0.14$ V remains with the p-well floating, so that this LV-SILC peak was confirmed to be due to tunneling between the n+ poly and NSD overlap region. The possible transport paths are electrons tunneling from n+ poly interface traps into the NSD CB, electrons tunneling from n+ poly interface traps into NSD interface traps, followed by thermal emission into the NSD CB. The electrons tunneling from n+ poly interface traps into the NSD CB mechanism is the more probable of the two due to the narrow energy range of traps at the NSD interface that can participate in the LV-SILC process.

The LV-SILC peak in the substrate current at $V_G=-0.26$ V seen in FIG. 6 is now analyzed. From a band analysis, the transport paths involving electron tunneling that can lead to an increase in $I_B$ at $V_G=-0.26$ V are electron tunneling from the n+ poly CB into p-well interface traps followed by recombination with holes, and electron tunneling from n+ poly interface traps to p-well interface traps followed by recombination with holes. The post stress activation energy ($\Delta H$ in eV) for $I_B$ was determined (was FIG. 14), The substrate current for the peak at $V_G=-0.26$ V is thermally driven with an activation energy of 0.43 eV, which is on the order of $\frac{1}{2}E_G$ ((Si). Additionally, the surface potential at $V_G=-0.26$ V is at approximately mid-gap for the p-well. Accordingly, this LV-SILC peak in the substrate current appears to be limited by electron-hole pair generation through mid-gap defects in the p-well created during stress. If the resulting hole is injected from the p-well into the n+ poly, a substrate current would appear. Therefore, in this voltage range, LV-SILC in the substrate terminal requires traps at the p-well interface. The peak in the $\Delta H$ vs. $V_G$ characteristic was found to appear whether the drain is connected or floating, indicating that this is not a gate controlled diode surface state generation current flowing through the p-well/NSD junction. The post-stress activation energy for $I_G$ was found to be nearly identical to the substrate current at $V_G=-0.26$ V, indicating that the creation of electron-hole pairs through mid-gap defects in the p-well does indeed result in carrier (hole) injection into the gate terminal. This is the only LV-SILC peak that was observed to be dominated by hole tunneling. Note that no corresponding LV-SILC gate current peak is observed in FIG. 4 (was FIG. 6). This appears to be consequent of the orders of magnitude difference between the gate and substrate currents. At time-0, the substrate current is 300 fA at $V_G=-0.26$ V. After stress, increase in $I_B$ at $V_G=-0.26$ V is 65 pA, while the magnitude of $I_G$ is 100 times larger. The presence of a gate current LV-SILC component was detected only in the thermal activation of the gate current.

Figures 9, 10:
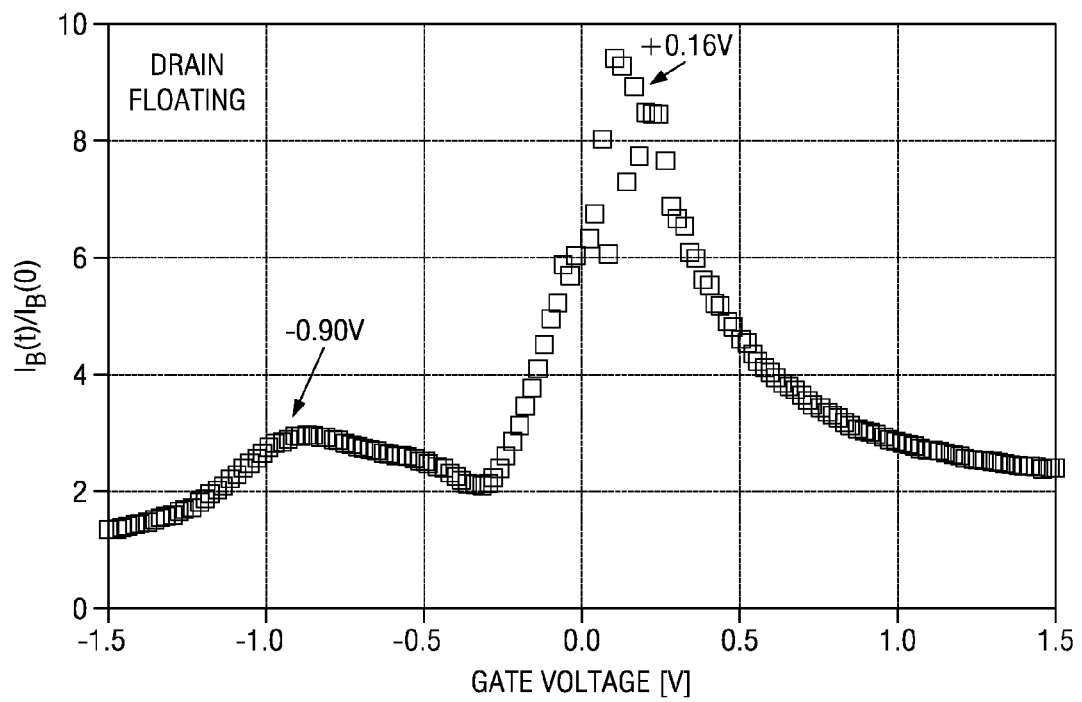
FIG. 9 shows $I_B(t)/I_B(0)$ obtained at 378 K with the drain floating during the sense operation, according to an embodiment of the invention.
FIG. 10 is a table that that shows depending on the value of the sense voltage chosen, low voltage stress-induced-leakage-current in the diffusion terminal can probe traps at the gate electrode-dielectric or the substrate-dielectric interface.

The change in substrate current with the drain floating is shown in FIG. 9. The change in gate current was found to have the same features. The peak at $V_G=-0.90$ V is still present, in agreement with the conclusion that traps at the p-well interface contribute to LV-SILC in this voltage range. As shown in FIG. 9, Another peak in $I_B$ appears at $V_G=+0.16$ V when the drain is floating. At this bias, $I_G$ was found to decrease from 16 nA to 5 pA since the floating drain cannot supply inversion layer electrons. Concurrently, $I_B$ has increased from 90 fA to 5 pA due to higher carrier generation rates resulting from the device being in deep depletion, so that this peak represents a small increase in current after stress. From the post stress activation energy ($\Delta H$) data described above, $I_G$ and $I_B$ are not strongly thermally activated at $V_G=+0.16$ V. Accordingly, carrier creation in the p-well is not dominated by either band gap or mid gap generation. The most likely explanation for the LV-SILC peak in $I_G$ and $I_B$ at $V_G=+0.16$ V is the injection of electrons from the p-well CB created by Band-To-Band Tunneling (BTBT) into n+ poly interface traps, followed by thermal emission into the n+ poly CB.

The LV-SILC peak in the substrate current at $V_G=-0.72$ V that is detected when all terminals are connected during the sense procedure as shown in FIG. 6 is now analyzed. There are no corresponding peaks in either $I_G$ or $I_D$ as shown in FIGS. 4 and 5, respectively. The post stress activation energy ($\Delta H$) data described above evidenced that shows that this peak has an activation energy of 0.4 eV, which is too high for tunneling of p-well VB electrons into n+ poly interface states to be a viable explanation since the traps that are unoccupied are too close to the n+ poly CB edge to result in a 0.4 eV tunneling barrier. This activation energy is also too high for BTBT, and generation of electron-hole pairs in the p-well through states within the silicon band gap is unlikely at this voltage since the p-well is in strong inversion. Tunneling of holes from the n+ poly VB into p-well interface traps can also be ruled out since this would result in a LV-SILC peak in $I_D$ due to recombination of inversion layer electrons (supplied by the drain) with the holes that are captured in p-well interface traps. Accordingly, there is no adequate explanation for this $I_B$ peak that involves a tunneling process between n+ poly and p-well. It was thus concluded that electrons in the NSD surface space charge region tunnel from the NSD VB into traps and are subsequently emitted through a 0.4 eV thermal barrier into the NSD CB. The resultant hole is injected into the p-well. For this peak, the sum of $V_G+\Delta H \sim E_G$(Si); consistent with a thermal emission tunneling process. Accordingly, the $I_B$ peak at $V_G=+0.72$ V shown in FIG. 6 requires traps at the NSD-SiON interface and does not have an $U_G$ component. Therefore, it was concluded that this peak in the substrate current is not related to a LV-SILC process. An $I_D$ component must also be present but cannot be detected due to the much larger magnitude of the drain current. It is possible that the traps that give rise to this peak in the substrate current are the same that resulted in the dip in $I_D$ at $V_G=-0.64$ V, as they are in approximately the same spatial location and energy position in the p-well band gap.

CONCLUSIONS

Using carrier separation techniques in three terminal devices to detect the post-stress increase in current with all terminals connected during sense, coupled with separate measurements where one terminal is floating during sense, a total of six peaks can be resolved in the post-stress I-V spectra of dielectrics, such as shown with the SiON dielectric described in this Example. Five of these peaks (of which one is observed only when the drain is floating) give rise to LV-SILC, where carriers tunnel between either the gate electrode and the substrate (n+ poly and p-well in this Example) or between the gate electrode and the diffusion (n+ poly and NSD in this Example) via interface traps at one or both interfaces. The sixth peak is due to thermal tunneling emission in the substrate/diffusion junction (NSD/p-well junction in this Example). Significantly, while conventional post-stress C-V measurements on these same samples detect only two interface trap peaks, both of which are located at the p-well interface, LV-SILC according to an embodiment of the invention provides a more sensitive resolution of the interface state spectra and detects interface traps at both the gate electrode and substrate interfaces (n+poly and p-well interfaces in this Example). Of the five trap peaks that contribute to LV-SILC, three were observed in the substrate current, and three were observed in the drain current. Three peaks are of sufficient magnitude to be resolvable in the gate current, and a fourth peak in the gate current can identified from the post-stress thermal activation energy.

The analysis performed showed the most likely physical explanations for the five LV-SILC trap peaks observed in the data described in this Example are as follows:

(1) $V_G \sim -1.02$ V (see FIG. 4): This peak is comprised of three components; electrons tunneling from n+ poly interface traps into p-well interface traps, electrons tunneling from the n+ poly CB into p-well interface traps, and electrons tunneling from n+ poly interface traps into the p-well CB. Accordingly, this peak thus senses traps at both dielectric interfaces.

(2) $V_G = -0.64$ V: (see FIG. 5) This peak (corresponding to a reduction in $I_D$) is due to electrons tunneling from the n+ poly CB into p-well interface traps near the NSD edge. The capture of these electrons into p-well interface states reduces the number of electrons that flow out of the drain relative to the unstressed condition due to the trapped electrons recombining with holes. This peak thus senses traps at the p-well interface near the NSD.

(3) $V_G = -0.26$ V: (see FIG. 6) This peak is due to electron-hole pair generation through mid-gap traps at the p-well interface, with the resulting hole tunneling from the p-well into n+ poly. This is the only LV-SILC peak where holes are the dominant carriers that are injected across the gate dielectric. This peak thus senses interface traps at the p-well interface.

(4) $V_G = -0.14$ V: (see FIGS. 4 and 5) This peak is due to electrons tunneling from n+ poly interface traps into the NSD CB. This peak thus senses traps at the n+ poly interface.

(5) $V_G = +0.16$ V. (see FIG. 9) This peak is only observed with the drain floating and is due to tunneling of p-well CB electrons created through BTBT into n+ poly interface traps. Thus, for this peak, traps involved in the LV-SILC process are located at the n+ poly interface.

When LV-SILC in the gate terminal is sensed at $V_{FB}$, traps at both gate electrode and substrate interfaces (n+ poly and p-well interfaces in this Example) are involved in the transport process. It has been suggested that LV-SILC is only due to tunneling from the n+ poly CB to p-well interface states because this transition represents the minimum barrier height for this system. However, the n+ poly depletes as the gate voltage is swept towards zero volts, while interface traps below the Fermi Level remain occupied. Accordingly, occupied n+ poly interface traps that are located at energies just below the n+ poly Fermi Level would be expected to play a significant role in the IV-SILC process, which has been demonstrated in this example through carrier separation measurements. The presence of the drain current LV-SILC peak near $V_{FB}$ is thus shown to be a two trap tunneling process.

This Example demonstrates that for MOS devices with ultra thin gate dielectrics sensed at $V_{FB}$, post stress carrier separation measurements confirm that LV-SILC as measured in the gate current is a two-trap tunneling process involving traps at both dielectric interfaces, the gate electrode-dielectric and the substrate-dielectric interfaces. In the off-state, LV-SILC in the substrate current only probes traps at the substrate-dielectric interface. Depending on the value of the sense voltage chosen, LV-SILC in the diffusion terminal (e.g. drain terminal) can probe traps at the gate electrode-dielectric or the substrate-dielectric interface. These findings are summarized in the table provided in FIG. 10.

| $V_{PEAK}$ [V] | Terminals sensing traps at poly-SiON interface | Terminals sensing traps at pwell-SiON interface |
|---|---|---|
| −1.02 | $I_D, I_G$ | $I_B, I_G$ |
| −0.64 |  | $I_B, I_D, I_G$ |
| −0.26 |  | $I_B, I_G$ |
| −0.14 | $I_D, I_G$ |  |
| +0.16 | $I_B, I_G$ |  |

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for evaluating gate dielectrics, comprising:
providing a test structure comprising a gate stack comprising a gate electrode on a gate dielectric on a substrate, and at least one diffusion region diffused in said substrate including a portion below said gate stack and a portion beyond said gate stack;
pre-stress off-state I-V testing on said test structure to obtain pre-stress I-V test data, said pre-stress off-state I-V testing comprising a first measurement involving said gate electrode, said substrate and said diffusion region, a second measurement involving said gate electrode and said substrate with said diffusion region floating, and a third measurement involving said gate electrode and said diffusion region with said substrate floating,
stressing comprising electrically stressing said test structure for a time (t);
following said stressing, post-stress I-V testing comprising repeating said first, second and third measurements to obtain post-stress I-V test data, and
evaluating said gate dielectric from said pre-stress and said post-stress I-V test data.

2. The method of claim 1, wherein said stressing further comprises thermally stressing said test structure at a temperature of at least 50° C. for said time (t).

3. The method of claim 2, wherein said temperature is at least 100° C. for said time (t).

4. The method of claim 1, further comprising the step of using said pre-stress and said post-stress I-V test data to obtain separate measures for a stress induced build-up of interface traps at:
(i) a first dielectric interface between said gate electrode and said gate dielectric and interface traps, and
(ii) at a second dielectric interface between said gate dielectric and said substrate.

5. The method of claim 1, wherein said pre-stress off-state I-V testing comprises obtaining a current as a function of voltage for said gate electrode $I_G(0)$, a current as a function of voltage for said diffused region $I_D(0)$, and a current as a function of voltage for said substrate $I_B(0)$, and said post-stress I-V testing comprises obtaining a current as a function of voltage for said gate electrode at time t $I_G(t)$, a current as a function of voltage for said diffused region at time t $I_D(t)$, and a current as a function of voltage for said substrate at time t $I_B(t)$, further comprising generating at least one ratio selected from:

(i) $I_G(t)/I_G(0)$, $I_D(t)/I_D(0)$, and $I_B(t)/I_B(0)$ or
(ii) $\Delta I_G/I_G(0)$, and/or $\Delta I_D/I_D(0)$, and/or $\Delta I_B/I_B(0)$, where $\Delta I_G=I_G(t)-I_G(0)$, $\Delta I_D=I_D(t)-I_D(0)$, and $\Delta I_B=I_B(t)-I_B(0)$, wherein said evaluating comprises using said ratio to evaluate a reliability for said gate dielectric.

6. The method of claim 5, wherein said evaluating comprises correlating an increase in said $I_B(t)$ as compared to said $I_B(0)$ when said diffusion region is floating to exclusively sense traps at an interface between said substrate and said gate dielectric.

7. The method of claim 5, wherein said evaluating comprises correlating an increase in said $I_D(t)$ as compared to said $I_D(0)$ with said substrate floating measured at a voltage corresponding to a peak in said $I_G(t)$ to exclusively sense interface traps at an interface between said gate electrode and said gate dielectric.

8. The method of claim 1, wherein said test structure comprises a MOS transistor and said electrically stressing comprises stressing said MOS transistor in inversion.

9. The method of claim 1, wherein said test structure comprises a MOS transistor and said electrically stressing comprises stressing said MOS transistor in accumulation.

10. The method of claim 1, wherein an equivalent oxide thickness (EOT) of said gate dielectric is <3.5 nm.

11. The method of claim 1, wherein said gate dielectric comprises a high-k dielectric.

12. The method of claim 1, wherein said gate electrode comprises polysilicon.

13. The method of claim 1, wherein said evaluating comprises comparing at least one parameter obtained from said pre and post-stress I-V test data for said gate dielectric to at least one reference value for said parameter, and
modifying at least one parameter in a semiconductor process based on said comparing.

14. The method of claim 1, wherein said evaluating comprises comparing at least one parameter obtained from said pre and post-stress I-V test data for said gate dielectric to at least one reference value for said parameter, and
modifying at least one parameter in a semiconductor process based on said comparing.

15. The method of claim 1, wherein test structure is on a wafer having a semiconductor surface, said wafer including a plurality of integrated circuit die, wherein said evaluating comprises:
comparing at least one parameter obtained from said pre and post-stress I-V test data for said gate dielectric to at least one reference value for said parameter, and
deciding whether to pass or accept said wafer based on said comparing.

16. The method of claim 1, wherein test structure is on a semiconductor die comprising a substrate having a semiconductor surface, and at least one functional circuit on said die, wherein said evaluating comprises:
comparing at least one parameter obtained from said pre and post-stress I-V test data for said gate dielectric to at least one reference value for said parameter, and
deciding whether to pass or accept said die based on said comparing.

* * * * *